Sept. 28, 1965 W. E. NELSON ETAL 3,209,200

CAVITY RESONATOR WITH TILTABLE TUNING MEMBER MOVABLE TOWARD AND AWAY FROM INTERACTION GAP OF RE-ENTRANT TUBES

Filed April 22, 1960

INVENTORS
Walter E. Nelson
Harry B. Smith

BY Wm J. Nolan
ATTORNEY

United States Patent Office 3,209,200
Patented Sept. 28, 1965

3,209,200
CAVITY RESONATOR WITH TILTABLE TUNING MEMBER MOVABLE TOWARD AND AWAY FROM INTERACTION GAP OF RE-ENTRANT TUBES

Walter E. Nelson, San Jose, and Harry B. Smith, Sunnyvale, Calif., assignors to Varian Associates, Palo Alto, Calif., a corporation of Califorina Filed Apr. 22, 1960, Ser. No. 24,098
4 Claims. (Cl. 315—5.52)

Figures 1, 2, 3, 4:
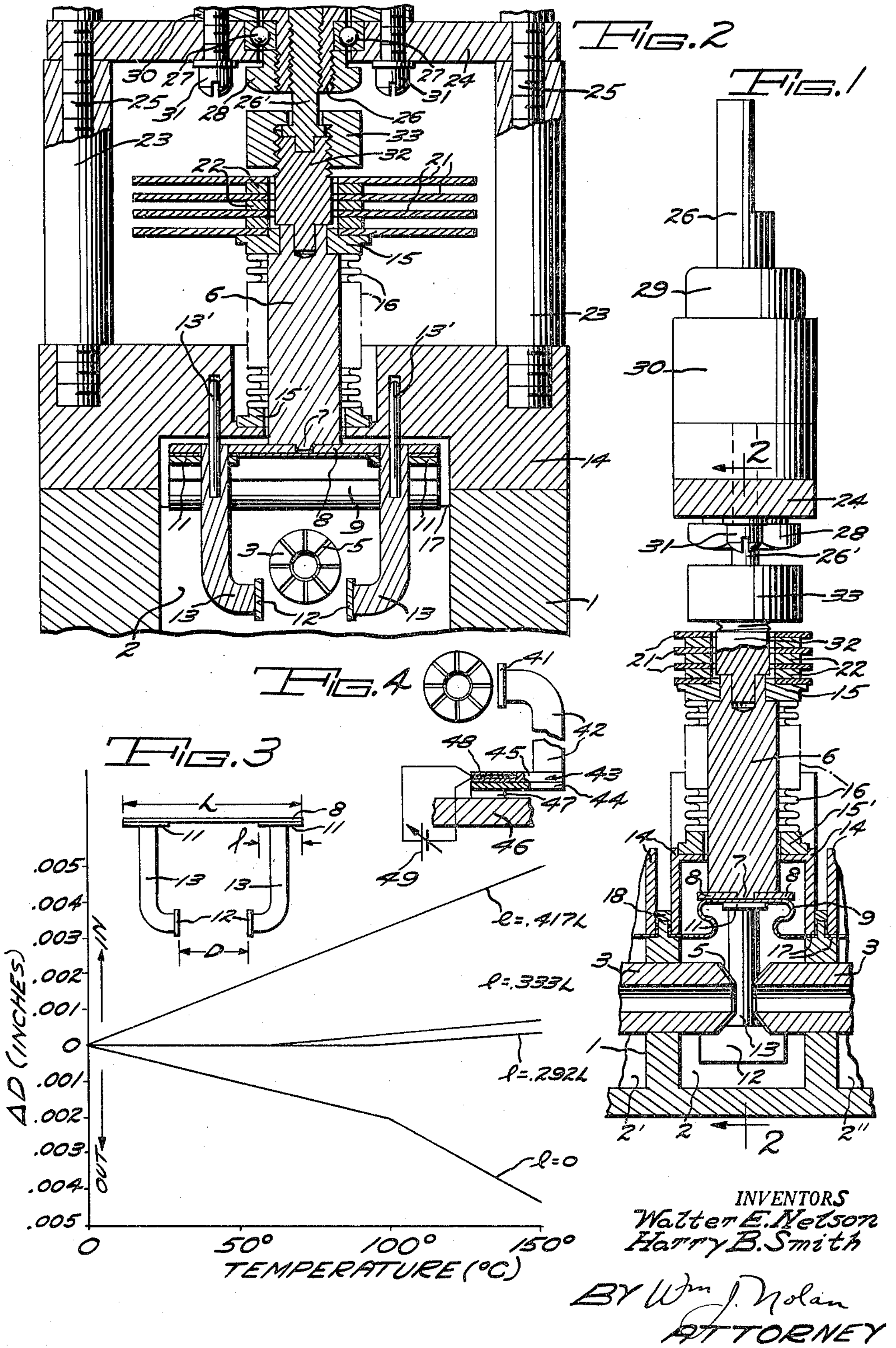

The present invention relates in general to high frequency cavity resonators of the type used, for example, in high power klystron tubes, and more particularly to a novel cavity resonator tiltable tuning structure preferably including an internally mounted bimetallic strip for thermally controlling the reactance of the resonator.

In the co-pending U.S. patent application Serial No. 749,225 of Robert C. Schmidt et al. entitled "High Frequency Tube Apparatus," filed July 17, 1958, now U.S. Patent 2,994,009 issued July 25, 1961, and assigned to applicants' assignee, there is disclosed and claimed a tunable re-entrant cavity resonator structure for a klystron tube comprising a movable cavity wall and a pair of spaced-apart capacitive tuning plates extending therefrom via support arms and positioned on the opposite side of the drift tube axis from said wall so that a change in inductance due to movement of the wall and the simultaneous change in capacitance due to the movement of the tuning plate are in the same sense thereby obtaining an extremely wide tuning range for a limited amount of tuner motion. It has been observed with respect to such a structure that excessive heating of the support arms and tuning wall caused by radio frequency currents at electron beam powers greater than about 500 watts effect substantial changes in the spacing between the capacitive tuning plates, thereby introducing undesired temperature instabilities in the cavity tuning. Although it is possible in many instances to prevent these instabilities by means of a circulating liquid cooling system, this adds to the complexity of the tube structure and further renders the tube undesirable for many applications as, for example, in transportable communication systems.

It is accordingly one object of the present invention to provide a cavity resonator structure in which the position of internally mounted tuning elements remains substantially stationary with changes in the cavity heating.

Another feature of the present invention is a novel cavity tuning structure wherein the tuning member is tiltable in a plane transverse to the beam axis of the cavity, the movement of said tuning member defining an arc intersecting with the interaction gap of the cavity.

An important problem existing with respect to cavity resonators containing internally mounted tuning elements relates to the fact that a flexible bellows vacuum envelope must be provided in order to use an external mechanical tuning mechanism. The delicate nature of such a bellows construction presents a probability of vacuum leaking and therefore is often a limiting factor in determining the life of the tube.

Thus, a second object of the present invention is the provision of a thermally tunable cavity resonator which does not require mechanical tuning mechanisms external to the cavity.

One feature of the present invention is the provision of a bimetallic strip structure for internally mounting a tuning element in a cavity resonator whereby the position of the tuning element and hence the reactance of the cavity varies in accordance with the temperature-dependent deflections of said bimetallic strip structure.

Another feature of the present invention is the provision of a cavity resonator structure comprising a cavity wall plate containing a bimetallic strip portion and a tuning element supported from said bimetallic portion whereby the tuning of the cavity resonator remains substantially constant with changes in the heating thereof.

Another object of the present invention is the provision of a structure in accordance with the preceding paragraph further including a tuning rod mechanism for moving said cavity plate and a bridge structure for supporting said mechanism, the coefficient of thermal expansion of the legs of said bridge being low relative to that of said tuner rod mechanism whereby the cavity resonator is temperature-compensated with respect to both internal radio frequency heating and external ambient temperature changes.

A still further feature of the present invention is the provision of a cavity resonator having a tuning element internally mounted therein by means of a bimetallic strip so that the cavity may be tuned by supplying preferential heating to said bimetallic strip.

These and other features and advantages of the present invention will become apparent upon a perusal of the following specification taken in connection with the accompanying drawings wherein, FIG. 1 is a cross-sectional view of a temperature compensated cavity resonator in accordance with the present invention, FIG. 2 is a cross-sectional view of a portion of the structure of FIG. 1, taken along line 2—2, FIG. 3 is a schematic representation of the tuner of FIGURES 1 and 2, together with curves showing the temperature variations in the spacing between the capacitive tuning elements thereof, FIG. 4 is an elevational view, partly in cross-section, of a thermally actuated tuner in accordance with the present invention.

Referring now to FIGURES 1 and 2, there is shown as an example of the present invention a cavity resonator used in an air-cooled four-cavity continuous-wave klystron power amplifier tube having a minimum power output of 1 kw., said cavity being tunable over a range extending from 4.2 to 6.0 kmc.

The main body of the tube comprises a copper cavity block 1 having a plurality of rectangular cavities 2, 2', 2'' formed therein, and supports a plurality of longitudinally aligned drift tube segments 3 re-entrantly extending into each cavity. The spaced-apart ends of the segments 3 form an interaction gap for a pencil-like beam of electrons passing therethrough, and are beveled and serrated to prevent multifactor power losses.

Above each cavity there is supported a copper tuning rod 6 securely brazed at mating boss 7 to a movable cavity tuning wall comprising a transversely extending copper backing plate 8 and a thin, flexible Monel diaphragm 9 brazed thereto. A pair of copper-plated molybdenum strips 11 is brazed to the surface of plate 8 to form a bimetallic strip portion at each end thereof, the diaphragm 9 being sandwiched between plate 8 and strips 11. Supported from said bimetallic portions, via securely inserted and brazed supporting arm rods 13, is a paid of longitudinally extending capacitive tuning plates 12 spaced-apart on opposite sides of the drift tube gap below the axis thereof. The arms 13 are disposed in a transverse plane of symmetry within the cavity in order to minimize R.F. heating currents and undesired modes of oscillation.

In assembly, the tuner rod 6 is inserted through a copper tuner block 14 and secured to flexible vacuum-sealing bellows 16 by means of upper ring 15. Bellows 16 is, in turn, secured to tuner block 16 by ring 15' seated therein. Next, the tuner block 14 is set on a shoulder 17 of the cavity block 1, the free ends of the diaphragm 9 being sandwiched therebetween. Guide pins 13', extending upwardly from the support arms 13 into mating holes in block 14 and serving to align the tuning elements, are made of tungsten in order to facilitate brazing and still provide a good bearing surface with the copper block 14 under high vacuum conditions. Finally, a copper spacing strip 18 is placed between adjacent tuner blocks 14 and the ends of the diaphragm 9 are brazed thereto in a vacuum-sealing manner. It is to be noted that the bendable diaphragm 9 extends inwardly of the translatable plate 8, thereby minimizing capacitive effects and forming a wide range inductive tuning wall of the type described and claimed in the copending U.S. patent application Serial No. 787,082 of Richard L. Walter and Walter E. Nelson entitled "High Power Klystron Tube Apparatus" filed January 15, 1959, now U.S. Patent 3,054,925 issued September 18, 1962, and assigned to applicants' assignee.

A stack of heat-radiating fins 21 separated by spacing rings 22 are brazed above the bellows ring 15 in order to provide air-cooling of the tuner assembly. A temperature-compensating bridge support comprising a pair of titanium legs 23 threadably inserted in tuner block 14 and a crossbar 24 securely supported therebetween by means of bolts 25 is of the type disclosed and claimed in the copending U.S. patent application Serial 842,782 of Louis T. Zitelli entitled "Klystron Amplifier," filed September 28, 1959 and assigned to applicants' assignee. The crossbar 24 rotatably supports an internally threaded tuner drive shaft 26 by means of a ball bearing race 27 and lock nut 28. Further supporting the tuner shaft 26 are a bearing 29 and a bearing retainer housing 30 secured to crossbar 24 by bolts 31. A plurality of dog members (not shown) may be mounted concentrically about the shaft 26 within housing 31 so as to establish definite stop positions corresponding to predetermined tuner frequencies. A tuning screw 26' having a small pitch, for example, .0125", to enable minute tuning movement is carried by the dive shaft 26. Screw 26' is captured by a stud cap 33 in the keyway of a Monel tuner stud 32 which is, in turn, brazed into the upwardly extending end of the tuner rod 6.

In operation, a tuning tool (not shown) mates with the notched upper end of shaft 26 to provide rotation thereof. Since the shaft 26 is captured against translation by the lock nut 28 and the tuning rod 6 is captured against rotation by guide pins 13', such rotation effects translation of the tuner rod 6 and hence the tuning wall plate 8. Sufficient clearance is provided in the openings of block 14 for guide pins 13' to allow a small inward deflection of support arms 13 in a manner to be described subsequently. Plate 8 moves inwardly to decrease the inductive reactance of the cavity and outwardly to increase this reactance in variable accordance with the direction of the rotation of the tuner rod shaft 26. Since the capacitive plates 12 are disposed below the re-entrant portions of the drift tube segments 13, it is seen that inward movement of the tuning wall 8, 9 serves to decrease the capacitive as well as the inductive reactance of the cavity. Conversely when the tuning wall is moved outwardly both the inductive and capacitive reactances are increased. Since the changes in these reactances are always in the same sense, large changes in tuning are obtained with relatively small changes in the position of the tuning members.

Once the tuning has been set, it has been found that changes in temperature due to the heating effect of radio frequency currents at high power levels will produce substantial changes in the relative position of the capacitor plates 12, thereby detuning the cavity. In accordance with the present invention such thermal detuning is compensated by means of the bimetallic strip portions on which the plate support arms 13 are mounted. As seen in FIGURE 3 each bimetallic strip, comprising the brazed-together portion of copper plate 8 with molybdenum strips 11, extends transversely for a distance $l$ which is less than one-half the total length L of the tuning wall plate 8. Since the coefficient of thermal expansion of molybdenum is considerably less than that of copper, the deflection of the bimetallic strip will cause the support arms 13 to bow inwardly in variable accordance with temperature so as to maintain the distance D between the capacitive plates 12 substantially constant.

It may be desirable in some instances to use other combinations of metals having substantially different thermal coefficients of expansion for the bimetallic strip portions. If the metal used for the short strips 11 have a coefficient which is larger than that of the backing plate 8, they would be secured on the outside surface of the plate rather than on the inside surface as shown in FIG. 3.

A sensitive adjustment for substantially complete compensation is obtained by suitably selecting the length $l$ of the bimetallic strips, as can be seen from the curves of FIGURE 3 which show the temperature variation of the tuning plate spacing deviation $\Delta D$ for various values of the fractional strip length $l$. These curves were obtained with a tuner in which the thickness of plate 8 was .100", the thickness of plate 11 was .030", the length of the arm 13 extending below the plate 11 was .550", and the length of the backing plate 8 was 1.20". Excellent compensation throughout the entire temperature range was obtained for a strip length of .350" or .292 L.

Compensation for external changes in the ambient temperature is provided by the bridge support in view of the fact that the titanium legs 23 have a coefficient of thermal expansion which is small compared to that of the tuner rod and shaft assembly. Thus as the ambient temperature rises, for example, the outward expansion of the cavity side walls is offset by the inward expansion of the tuner rod 6. It is to be noted that a certain amount of internally generated heat will be conducted through the tuner block 14 and will also cause a slight inward expansion of rod 6. It is for this reason, and also for the reason that the internal heating causes arms 13 to elongate, that it is desirable for the plate spacing D to exhibit a slight inward tendency with increasing temperature.

At an output power level of about 1 kw., the temperature of the backing plate 8 will rise to a value in excess of 100° C. Thus it is seen from the lowermost curve of FIG. 3 that a deviation $\Delta D$ of several thousandths of an inch occurs in the absence of the bimetallic strips of the present invention. Since the tuning sensitivity is about 6 mc. per thousandths of an inch, a substantial detuning in excess of 10 mc. is prevented in the described embodiment.

The success of bimetallic strip structure of FIG. 3 in compensating for the large amounts of detuning suggests the use of a similar structure as a thermal tuner which would eliminate the need for a fragile vacuum bellows. This aspect of the invention is illustrated in FIG. 4 wherein a capacitive tuning plate element 41, positioned closely adjacent to the drift tube gap for maximum sensitivity, is supported via arm 42 to a bimetallic mounting strip 43 wherein the outside layer 44 is of a material housing a higher coefficient of expansion than that of the inside layer 45. The bimetallic strip 43 is attached to the lower cavity wall 46 via a support member 47, preferably of a material exhibiting a low heat conduction. A winding 48 of resistance heater wire, inserted in strip 43 by means of a small hole drilled therein, is energized by means of a variable voltage source 49 to supply preferential heating to said strip.

Thus the output of the voltage source 49 controls the temperature of the bimetallic strip 43 and causes the capacitive tuning plate element 41, as carried on the support arm 42, to tilt around a tilting axis substantially removed from the axis of the interaction gap. In this manner, the tuning element 41 is caused to move in an arcuate path centered about the tilting axis with the arcuate path intersecting the re-entrant drift tube segments, thereby providing a sensitive means for changing the tuning of the cavity. The walls of the cavity are preferably made thick and non-deformable in order to eliminate microphonic disturbances. And the length of the support arm 12 is preferably arranged to be as long as possible, consistent with good cavity design, for maximum range of tuning plate motion.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a velocity modulation tube having a plurality of cavities successively arranged for velocity modulation of a beam of electrons and including a tunable cavity resonator structure comprising: a cavity resonator having a pair of coaxially aligned axially spaced apart drift tube segments re-entrantly projecting into said cavity and defining an electron interaction gap therebetween therein, the interaction gap having an axis coaxial with the axes of said drift tube segments; a cavity tuning structure disposed within said cavity resonator for tuning thereof and including, a capacitive tuning member disposed adjacent said interaction gap, an elongated support arm carrying said tuning member and generally extending away from the interaction gap axis in a plane transverse thereto, said arm being tiltably supported about an axis generally parallel to and substantially removed from the axis of the interaction gap whereby relatively small tilting movements of said arm near said tilting axis produce substantially amplified translations of said tuning member toward and away from the axis of said interaction gap for varying the capacity across said gap and thereby changing the resonant frequency of said cavity resonator, said tuning member being formed and arranged with respect to said tiltable support arm, tilting axis, interaction gap, and drift tube segments such that the tuning motion of said tuning member causes the tuning member to sweep a path having a substantial width which path width has a substantial portion radially coextensive with the annulus centered on the tilting axis and defined in radial thickness by the radial thickness of the cross-section of said drift tube segments whereby the capacitive tuning effect is maintained; and means for tilting said support arm about said tilting axis for tilting said capacitive tuning member toward and away from the axis of said gap while confining the direction of motion of said capacitive tuning member to a plane substantially transverse to the axis of said interaction gap.

2. In a klystron tube, a combination comprising: a cavity resonator having a pair of coaxially aligned axially spaced-apart drift tube segments re-entrantly projecting into said cavity resonator and defining an electron interaction gap therein, said interaction gap having an axis coaxial with the axes of said drift tube segments; a cavity wall plate containing a bi-metallic strip portion disposed within said cavity resonator, said bi-metallic strip portion tilting in variable accordance with the local application of heat thereto; a capacitive tuning member portion disposed adjacent said interaction gap for tuning of said cavity resonator; a tuner support structure interconnecting said capacitive tuning member portion and said tiltable bi-metallic strip portion whereby tilting of said bi-metallic strip portion causes said capacitive tuning member portion to move toward the axis of said gap thereby increasing the capacity of said cavity resonator and lowering the frequency thereof.

3. The combination of claim 2 wherein the changes in position of said capacitive tuning member portion, due to the tilting of said bi-metallic strip, compensates for the thermal detuning of said cavity resonator due to internal radio frequency heating of said tuner support structure and said wall plate.

4. In a klystron tube, the combination comprising: a cavity resonator having a pair of spaced-apart drift tube segments re-entrantly defining an electron interaction gap therein, an inductive tuning wall comprising a metallic plate movably mounted within said cavity and a flexible metallic diaphragm extending inwardly from said tuning plate and secured to said cavity resonator, a metallic strip secured to the inside surface of said wall plate at each end thereof, an elongated inwardly extending arm secured to each end strip, a capacitive tuning plate secured at the end of each support arm and positioned in spaced-apart relation adjacent said interaction gap on the opposite sides of the axis of said drift tube segments from said inductive tuning wall to effect wide tuning of said cavity resonator, said cavity resonator tending to be thermally detuned by the local radio frequency heating of said elongated arm and said tuning wall plate, said metallic strips having a lower thermal coefficient of expansion than said tuning wall plate whereby said thermal detuning of said cavity resonator is compensated by temperature dependent bi-metallic tilting of said tuning wall plate which cause said dependent capacitive tuning plate members to pivot about an axis substantially parallel to and displaced from the axis of said drift tube segments thereby causing said capacitive tuning plate members to describe an arcuate path having a direction transverse to the axis of said drift tube segments whereby small tilting deflections produce relative large movements of said capacitive tuning plate members.

References Cited by the Examiner

UNITED STATES PATENTS

| | | | |
|---|---|---|---|
| 2,109,880 | 3/38 | Dow | 333—82 |
| 2,429,295 | 10/47 | Quitter | 315—39.59 |
| 2,449,090 | 9/48 | Spencer | 315—39.59 |
| 2,531,214 | 11/50 | Harris et al. | 333—83 |
| 2,621,311 | 12/52 | La Rue | 315—39.59 |
| 2,667,623 | 1/54 | Martin | 333—83 |
| 2,968,013 | 1/61 | Auld | 333—83 |
| 2,994,009 | 7/61 | Schmidt et al. | 333—83 X |

FOREIGN PATENTS

| | | |
|---|---|---|
| 55,646 | 5/52 | France. |

HERMAN KARL SAALBACH, *Primary Examiner.*

ELI J. SAX, *Examiner.*